United States Patent [19]

Easley

[11] 4,237,415

[45] Dec. 2, 1980

[54] METHOD AND APPARATUS FOR MEASURING CONDUCTIVITY IN ELECTRICAL FEEDTHROUGH

[75] Inventor: John K. Easley, Pittsfield, Mass.

[73] Assignee: General Electric Company, New York, N.Y.

[21] Appl. No.: 959,687

[22] Filed: Nov. 13, 1978

[51] Int. Cl.³ .............................................. G01R 31/12
[52] U.S. Cl. ........................................ 324/54; 324/62
[58] Field of Search ..................... 324/51, 62, 54, 421, 324/439

[56] References Cited

U.S. PATENT DOCUMENTS

| 1,721,847 | 7/1929 | Austin | 324/54 |
| 2,802,176 | 8/1957 | Anderson et al. | 324/54 |
| 2,889,395 | 6/1959 | Frakes | 324/54 |
| 3,514,695 | 5/1970 | Skarshaug | 324/54 |

Primary Examiner—Michael J. Tokar
Attorney, Agent, or Firm—Francis X. Doyle; Richard A. Menelly

[57] ABSTRACT

Feedthrough bushings containing electrically conductive coatings on the porcelain outer shell are provided with means for electrically monitoring the state of conductivity of the coatings. An electrical feedthrough connecting with the electrically conductive coating at one end provides an efficient means for connecting with current measuring devices to determine the current through the coating while the bushing remains energized.

2 Claims, 4 Drawing Figures

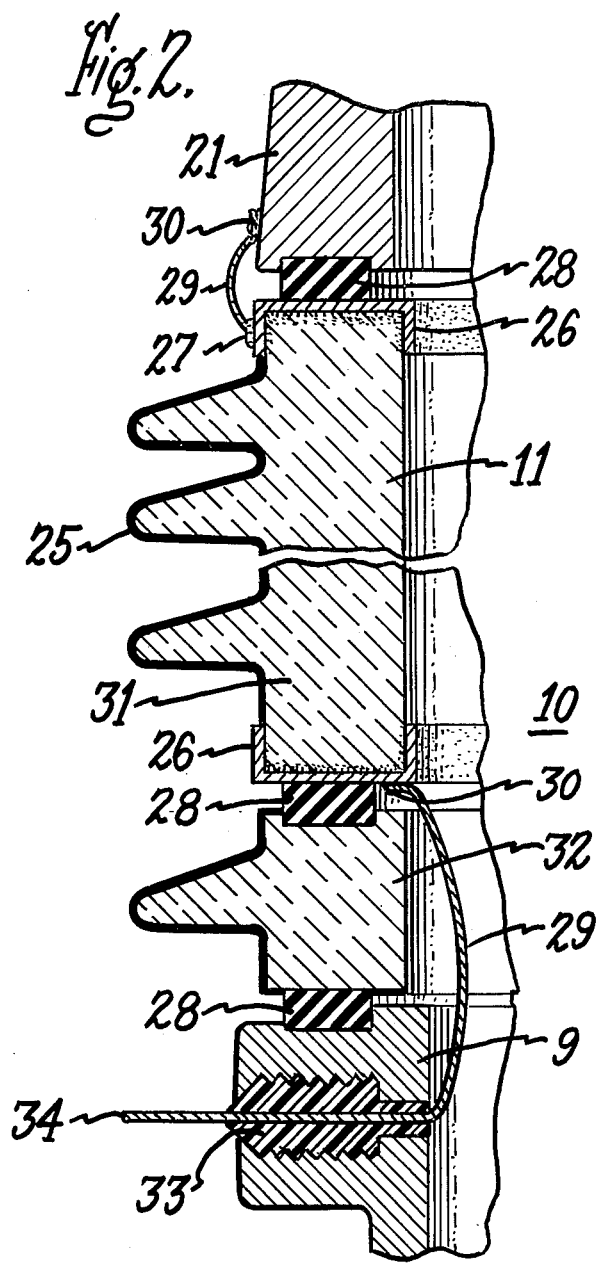

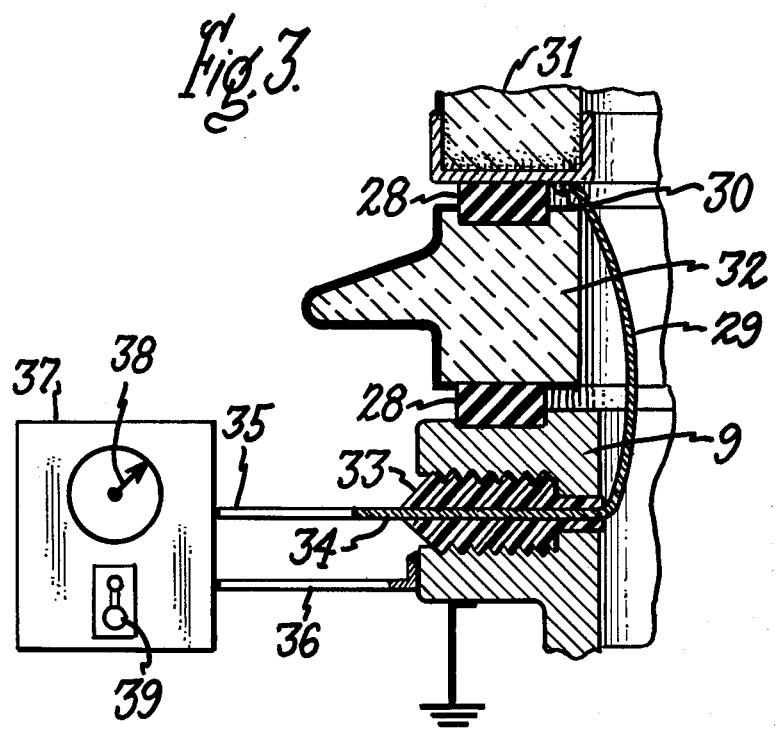
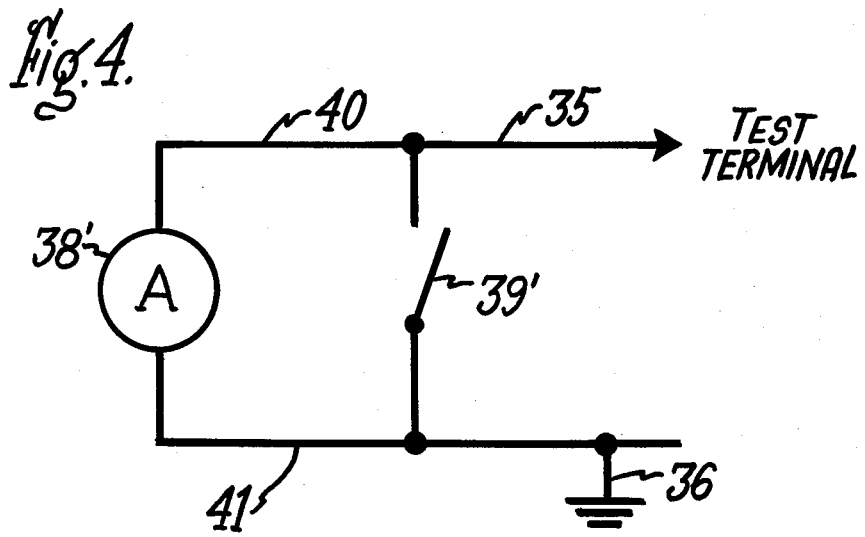

METHOD AND APPARATUS FOR MEASURING CONDUCTIVITY IN ELECTRICAL FEEDTHROUGH

BACKGROUND OF THE INVENTION

This invention relates to electrical feedthrough bushings of the type used for providing electrical connection to within the interior of power transformer assemblies. The bushings generally comprise an electrical conductor within a porcelain enclosure containing a quantity of paper insulating material and mineral oil for cooling and insulation purposes. The outer surfaces of the porcelain housing are provided in a radially extending plurality of skirts for generating the longest possible electrical path length for a reasonably short overall linear extent. When porcelain is used as the outer jacket material a quantity of dirt accumulates on the porcelain surface over extended periods of use. During conditions of high humidity and during periods of gentle rain the portions of the porcelain surface directly subjacent the extending skirts remain reasonably dry whereas the outer exposed surfaces of the skirt contain small accumulations of water. When the bushings are used in high voltage applications it is sometimes possible for arcing to occur between the wet portions of the porcelain assembly such that an arc discharge can eventually occur between the top and bottom terminals of the bushing causing the bushing to become inoperative.

The current state of the bushing art utilizes an electrically conductive glaze coating on the outer surface of the porcelain outer jacket to provide a high resistance current path between the bushing terminals. The purpose of the conductive coating is to prevent an excess build-up of charge on the porcelain surface and to generate sufficient heat to deter the accumulation of moisture. Upon continued exposure to the elements the chemical and electrical properties of the conductive glaze may become altered to such an extent that the conductive glaze is no longer capable of providing the outer surface high resistance current path. At this point the bushing behaves similar to a plain porcelain insulated bushing and summarily becomes subjected to the moisture conditions described earlier.

The purpose of this invention is to provide a means for electrically monitoring the condition of the conductive glaze coating in order to determine whether the bushing is operating in the conductive glaze mode or as a conventional bushing.

SUMMARY OF THE INVENTION

The invention comprises electrical contact between the top terminal of a feedthrough bushing and the top of an electrically conductive glaze coated porcelain jacket and an insulated electrical terminal connecting with the bottom portion of the coated porcelain jacket. Electrical continuity through the conductive coating is determined by connecting current measuring means between the bottom portion and ground. Continuous monitoring of the electrical current through the coating determines the condition of the conductive coating throughout the life of the bushing.

BRIEF DESCRIPTION OF THE DRAWINGS

FIG. 2 is a side view in partial section of one embodiment of the terminal connection means employed with the bushing of FIG. 1;

FIG. 3 is a sectional view of the current access means of FIG. 2 with a monitoring module electrically connected therewith; and FIG. 4 is a schematic diagram of the electrical arrangement between the bushing and monitor module of FIG. 3.

DESCRIPTION OF THE PREFERRED EMBODIMENT

Figure 1:
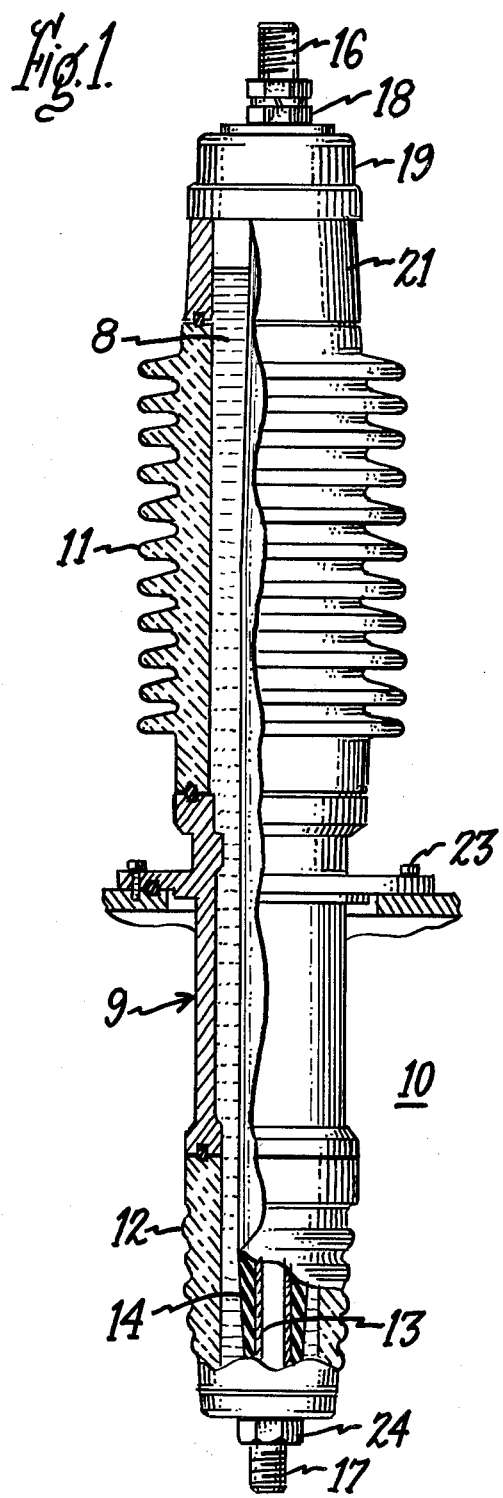
FIG. 1 is a side perspective view in partial section of an electrical feedthrough bushing for use with electric current monitoring means according to the invention.

FIG. 1 is an electrical feedthrough bushing 10 of the type having a top porcelain housing 11 and a bottom porcelain housing 12 containing a central conductor 13 concentrically within the top and bottom porcelain housings. Although porcelain housings are disclosed it is to be clearly understood that other insulating materials such as glass, plastic and rubber can also be employed. The conductor 13 is a metallic tube containing a wrapping of paper core material 14 to provide electrical insulation between the conductor 13 and the tubular mounting flange 9. The bushing further contains a quantity of mineral insulating oil 8 to add further insulation between the central conductor 13 and the top and bottom porcelain housings 11, 12 which will be herein referred to simply as "porcelains". Electrical connection to the bushing is made by means of a top terminal 16 and a bottom terminal 17 which are generally mechanically attached to the bushing by means of a top clamping nut 18 and a bottom nut 24 respectively. The bushing further contains an expansion chamber 21 held to the top of the bushing by means of a compression spring assembly 19. The expansion chamber generally consists of a large transparent glass housing for serving the further purpose of viewing the level of the insulating oil to determine whether there is sufficient oil for insulating and cooling purposes. The top and bottom porcelains are joined by means of the mounting flange 9 which is attached to the transformer housing by means of lugs 23 such that the top porcelain 11 is outside the transformer and the bottom porcelain 12 is within the transformer casing. A potential tap outlet (not shown) is sometimes employed for the purpose of measuring the bushing capacitance. When a conductive glaze coating is applied to the top porcelain 11 for the purposes which were described earlier the expansion chamber is sometimes formed of a metal substance in order to promote electrical continuity between the top terminal and the electrical conducting coating.

FIG. 2 shows a bushing 10 of the type having a metal expansion chamber 21 and a top porcelain 11 containing a coating of an electrically conducting glaze 25. Since an insulating sealing gasket 28 is provided between the metal expansion chamber and the top porcelain 11 a thick film of a metallized coating 26 is applied to the top of porcelain 11 and an electrically conducting strap 29 is connected to the metallized coating by means of a solder contact 27 and to the metal chamber 21 by means of a solder contact 30. Other connecting means such as spring clips can also be employed. The bottom portion 31 of porcelain 11 also contains a layer of metallized coating 26 for providing electrical continuity between a test lead 34 which is connected to the coating by means of the strap 29 and contact 30. The bottom end of porcelain 11 is separated from a porcelain separator 32 by means of sealing gasket 28 and the support 32 is separated from the electrically conducting flange 9 by means of sealing gasket 28. The connecting strap 29 therefore provides electrical continuity between the conducting glaze 25 and test terminal 34 without contacting or connecting with flange 9 which is usually at ground potential. The test terminal 34 is separated from flange 9 by means of an insulating feedthrough 33 which concentrically houses lead 34 and engages flange 9.

The purpose of test lead 34 is to provide electrical connection to the conducting glaze 25 in order to measure the conductive properties of the glaze. This is done generally by connecting an electrical ammeter between terminal 34 and ground when the bushing is fully energized. This is a substantial improvement over prior art bushings containing electrically conducting glazes wherein the bushing must be de-energized and resistance readings taken by contacting the conductive glaze near the top and bottom of the porcelain with some type of a resistance measuring device. It is difficult to obtain accurate current readings through the conductive glaze when the bushing is energized since the conducting glaze is electrically connected to ground. When bushings which contain the electrically conductive glaze coatings are used in high power transformers, steps must be taken to insure that the operator does not come into contact with the very high voltages involved. FIG. 3 shows one means for monitoring the current through the conductive glaze without having to approach to within the vicinity of the bushing.

An electrical monitoring module 37 containing a direct reading ammeter dial 38 and a normally closed switch 39 are connected to the test terminal 34 by means of a first lead 35 and to the ground bushing by means of a second lead 36. The module can be located at a safe distance from the bushing and the ground connection between the electrically conducting glaze and ground can be broken by opening normally closed switch 39 and allowing the current through the conducting glaze to pass through an ammeter for direct reading upon ammeter dial 38. This arrangement therefore allows the conductive glaze to be continuously connected with ground and disconnected temporarily for the purpose of reading the current through the coating.

FIG. 4 shows the electrical circuit used for the module 37 of FIG. 3. Lead 40 connects between one side of ammeter 38' and test terminal 34. Lead 41 connects to the other side of ammeter 38' and ground. Normally closed switch 39' connects between leads 40 and 41 to insure continuous current through the coating as described earlier and upon being opened allows current to transfer through ammeter 38' to give an accurate reading of the current value. Module 37 can consist of a single jack connection of the type consisting of a spring loaded normally closed switch and a portable ammeter having a male extension thereon can be inserted within the jack to disconnect the bushing from direct connection with ground and for inserting the ammeter between the coating and ground. Ammeter 38' can in some applications be continuously connected between the coating and ground such that switch 19' is not required. A continuous reading ammeter recorder can be substituted for ammeter 38' when it is important to take continuous time traces of the value of the current flowing through the conductive coating over long periods of operation.

The invention is described relative to bushings used within high voltage power transformer but this is by way of example only. The bushing arrangement of the invention finds application wherever bushings containing electrically conductive coatings may be employed.

I claim:

1. A method for measuring the current through a conductive coating on a porcelain bushing jacket comprising the steps of:
    providing an insulated electrical feedthrough intermediate the ends of the jacket and connected at one end to the conductive coating;
    connecting the feedthrough at the other end to one side of a current reading ammeter; and
    connecting the other side of the ammeter to ground.

2. The method of claim 1 further including the step of electrically connecting a switch in shunt relation between the ammeter and ground; and
    opening the switch to provide current transfer through the ammeter for determining the current through the coating.

* * * * *